United States Patent
Russell

(10) Patent No.: US 7,059,268 B2
(45) Date of Patent: Jun. 13, 2006

(54) METHOD, APPARATUS AND MAGNET ASSEMBLY FOR ENHANCING AND LOCALIZING A CAPACITIVELY COUPLED PLASMA

(75) Inventor: Derrek Andrew Russell, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 28 days.

(21) Appl. No.: 10/324,213

(22) Filed: Dec. 20, 2002

(65) Prior Publication Data

US 2004/0121610 A1    Jun. 24, 2004

(51) Int. Cl.
*H01L 21/302* (2006.01)

(52) U.S. Cl. .......................... 118/723 E; 118/723 MA; 156/345.46; 156/345.47

(58) Field of Classification Search ........... 156/345.43, 156/345.44, 345.45, 345.46, 345.47; 118/723 E, 118/723 MA; 315/111.21, 111.41
See application file for complete search history.

(56) References Cited

U.S. PATENT DOCUMENTS

| | | | |
|---|---|---|---|
| 4,422,896 A | | 12/1983 | Class et al. |
| 4,492,610 A | * | 1/1985 | Okano et al. ............... 438/729 |
| 4,525,262 A | | 6/1985 | Class et al. |
| 4,581,118 A | | 4/1986 | Class et al. |
| 4,632,719 A | * | 12/1986 | Chow et al. ........... 156/345.46 |
| 4,657,619 A | * | 4/1987 | O'Donnell ............. 156/345.46 |
| 4,842,707 A | * | 6/1989 | Kinoshita .............. 204/298.37 |
| 4,871,433 A | | 10/1989 | Wagner et al. |
| 4,950,956 A | | 8/1990 | Asamaki et al. |
| 5,016,564 A | * | 5/1991 | Nakamura et al. ... 118/723 MR |
| 5,032,202 A | | 7/1991 | Tsai et al. |
| 5,079,481 A | | 1/1992 | Moslehi |
| 5,081,398 A | * | 1/1992 | Asmussen et al. ...... 315/111.41 |
| 5,399,253 A | * | 3/1995 | Grunenfelder ........... 204/298.2 |
| 5,411,624 A | | 5/1995 | Hirano et al. |
| 5,449,977 A | | 9/1995 | Nakagawa et al. |
| 5,474,643 A | | 12/1995 | Arami et al. |
| 5,476,182 A | | 12/1995 | Ishizuka et al. |
| 5,484,485 A | * | 1/1996 | Chapman ................ 118/723 R |
| 5,828,176 A | * | 10/1998 | Goebel ................... 315/111.41 |
| 6,027,603 A | | 2/2000 | Holland et al. |
| 6,030,486 A | * | 2/2000 | Loewenhardt et al. . 156/345.46 |
| 6,132,576 A | | 10/2000 | Pearson |
| 6,471,830 B1 | | 10/2002 | Moslehi et al. |
| 6,562,189 B1 | | 5/2003 | Quiles et al. |
| 2001/0032591 A1 | | 10/2001 | Carducci et al. |

FOREIGN PATENT DOCUMENTS

JP             04324631 A  *  11/1992

* cited by examiner

*Primary Examiner*—Parviz Hassanzadeh
*Assistant Examiner*—Michelle Crowell
(74) *Attorney, Agent, or Firm*—Wood, Herron & Evans,L.L.P.

(57) ABSTRACT

A magnetically enhanced plasma is produced with a permanent magnet assembly adjacent to a radio frequency (RF) biased wafer support electrode in a vacuum processing chamber of a semiconductor wafer processing apparatus. An annular peripheral region is provided on the wafer support around the perimeter of the wafer being processed. A magnet arrangement using a plurality of magnet rings forms a magnetic tunnel over the peripheral region at which the plasma is generated away from the wafer. The magnetic field has components parallel to the substrate support surface over the annular peripheral region but which are perpendicular to the surface at the wafer. Preferably, the magnetic field has a flat portion parallel to the support surface in the peripheral region. Plasma propagates by diffusion from the peripheral region across the wafer surface. The magnets can be manipulated to optimize plasma uniformity adjacent the substrate being processed.

22 Claims, 3 Drawing Sheets

METHOD, APPARATUS AND MAGNET ASSEMBLY FOR ENHANCING AND LOCALIZING A CAPACITIVELY COUPLED PLASMA

This invention relates to the plasma processing of substrates, particularly semiconductor wafer substrates, and to the generation, enhancement and control of plasmas, particularly capacitively coupled plasmas, in such processing.

BACKGROUND OF THE INVENTION

Plasma is used in the production of semiconductors in processes such as plasma etching, ionized physical vapor deposition (iPVD) and plasma-enhanced chemical vapor deposition (PECVD). Plasma is often produced for such applications by capacitively coupling energy into a processing gas in a vacuum chamber to dissociate molecules of the gas into reactive free radicals and atoms, to excite molecules, radicals and ions of the gas into higher electronic states, to ionize molecules and atoms of reactive and inert gas, and to accelerate ions into trajectories normal to the surface of a substrate and onto the substrate.

In PECVD plasma processing applications, capacitive coupling may be used to dissociate and excite molecules of a processing gas into reactive free radicals so that a desired thin film can be grown on the substrate. In plasma etch applications, capacitive coupling of a plasma may be used to activate a process gas to remove material from the substrate, either by exciting reactive atoms or radicals in a process known as reactive ion etching (RIE) or by ionizing atoms of inert gas in a process commonly referred to as sputter etching. In iPVD, a capacitively coupled plasma (CCP) may be used as a primary plasma source to produce ions of coating material or may be used in connection with a separate substrate table bias, to collimate the flux of coating material ions at the substrate or to ionize inert gas atoms and accelerate ions to the substrate in a post-deposition sputter etch step.

A simple CCP processing application involves the placing of a substrate on an electrode that is biased with radio frequency (RF) power. The electrode and substrate are enclosed in a grounded vacuum chamber that serves as an outer electrode. This arrangement requires high and often excessive RF voltages to generate sufficient plasma density to perform the process efficiently. Such high voltages can damage devices in integrated circuits as well as cause arcing within the chamber. Further, with such systems, plasma uniformity and subsequently etch or deposition uniformity on the substrate are unpredictable and often unsatisfactory. Typically, etch and deposition uniformity are dependent on details of the process environment, such as the shapes of shields, the locations of gas injection ports, and other chamber features. Further, using a delicate substrate exclusively as an electrode usually results in excessive substrate temperature.

Attempts to overcome the limitations of CCPs described above have involved the use of magnetic enhancement near the substrate support electrode. This enhancement can be produced by use of a magnetic field of an appropriate magnitude oriented parallel to an RF biased substrate support to cause electrons near the electrode surface to move in cycloid orbits next to the plane of the electrode instead of moving away from it, as they would otherwise tend to do. As a result, the electrons in the plasma interact with the RF plasma sheath multiple times before being lost to the walls of the chamber. If the magnetic field forms a closed loop, the electrons have no fixed point of exit from the field and are trapped, potentially indefinitely, under the magnetic field. This trapping of electrons near the electrode surface results in larger amounts of energy being delivered to the electrons per volt of RF sheath potential. Hence, much smaller voltages are needed to achieve a given plasma density.

A major drawback of magnetic enhancement in the prior art plasma processing of integrated circuits is device damage due to non-uniform charging effects of the substrate. A non-uniform charge distribution along an insulated substrate surface results in voltage gradients across devices on the substrate, which can lead to voltage breakdown. Non-uniform charging of the substrate can be caused by strongly non-uniform plasma density across the substrate surface. Such non-uniformity in plasma can be caused by lines of magnetic flux intersecting the substrate surface at predominantly normal angles of incidence at different strengths across the surface of the substrate or in regions where the ionizing electrons are being produced.

An example of a magnetic enhancement at the substrate support in the prior art is described in U.S. Pat. No. 5,449,977. The arrangement produces lines of magnetic field that are parallel to the surface of a substrate and act to induce cycloid orbits on localized regions of the substrate support called the cycloid regions. The resulting non-uniform plasma can be made axially symmetric in a time-averaged sense by rotating the arrangement during processing of the wafers. A main drawback of this scheme is the need for costly and complex rotating hardware.

Accordingly, there remains a need for a method and apparatus for the maintenance of a substantially uniform low voltage plasma adjacent a semiconductor wafer substrate for plasma processing.

SUMMARY OF THE INVENTION

An objective of the present invention is to provide for the uniform distribution of a low voltage plasma across the surface of a substrate during processing, particularly in vacuum plasma processes for the manufacture of semiconductor wafers. A more particular objective of the invention is to provide a method, plasma source and processing apparatus for distributing a low-voltage high-density plasma at the surface of a wafer being processed that produces minimal charge distribution non-uniformity across the wafer and avoids wafer damage.

A further objective of the invention is to provide a magnetically enhanced plasma at the surface of a wafer that is useful for a variety of semiconductor manufacturing processes including but not limited to PECVD, iPVD, REI and sputter etching.

According to principles of the present invention, a magnetically enhanced or magnetron plasma source is provided that operates to capacitively couple RF energy into an annular magnetic tunnel around the annular peripheral region of a wafer support surrounding a wafer supported on a central region of the support to form a plasma at an annular peripheral region from which the plasma diffuses inwardly over the wafer. The tunnel is produced by magnets configured adjacent the peripheral region and remote from the central region on which the wafer is supported. The magnets produce a magnetic field that is generally parallel to, or has substantial components that are parallel to, the surface of the support over the annular peripheral region. The field also is generally perpendicular to the support at the central region.

According to an embodiment of the invention, a plasma processing apparatus having a vacuum chamber is provided with a wafer support within the chamber having a central wafer supporting surface and an annular peripheral surface surrounding the central wafer supporting surface. An RF generator is coupled to the wafer support. An annular permanent magnet assembly is provided adjacent the annular peripheral surface of the wafer support. The assembly has two or more ring shaped magnet poles and is configured to form an annular magnetic tunnel adjacent the annular peripheral surface and surrounding the central wafer supporting surface so as to trap plasma forming electrons in the tunnel away from a wafer on the central wafer supporting surface. Plasma forms in the tunnel and diffuses inwardly from the tunnel over the surface of a wafer supported on the central wafer supporting surface.

In certain embodiments of the invention, an annular permanent magnet assembly is located behind the annular peripheral surface of the wafer support and produces the magnetic tunnel with a magnetic field arcing from the magnet poles through and over the surfaces of the support. In alternative embodiments, the annular permanent magnet assembly is located opposite and spaced from the annular peripheral surface of the wafer support and produces the magnetic tunnel with a magnetic field arcing from magnet poles toward and through the surfaces of the support. Preferably, the annular permanent magnet assembly is configured to produce a resultant magnetic field over the surfaces of the wafer support that includes resultant magnetic flux lines generally parallel to and over the annular peripheral surface, and generally perpendicular to and through the central wafer supporting surface.

In certain embodiments of the invention, the annular permanent magnet assembly includes a high magnetic permeability material, an outer annular magnet ring and an inner annular magnet ring, the rings having opposite poles in contact with, or in close proximity to, the high magnetic permeability material.

The inner and outer annular magnet rings may have their polar axes perpendicular to the surfaces of the wafer support and oppositely oriented. Alternatively, the outer annular magnet ring has a polar axis perpendicular to the surfaces of the wafer support with a pole facing the annular peripheral surface of the wafer support while the inner annular magnetic ring has a polar axis parallel to the surfaces of the wafer support and its corresponding pole facing radially away from the central wafer supporting surface. The annular permanent magnet assembly preferably also has an intermediate magnet ring that has a polar axis parallel to the surface of the wafer support with its outwardly facing pole opposing the pole of the outer ring that faces the support.

The annular permanent magnet assembly is preferably configured to produce a magnetic field that is generally flat over at least a portion of the annular peripheral surface that lies radially outward of the periphery of a wafer on the support.

These and other objectives and advantages of the present invention will be more readily apparent from the following detailed description of the drawings.

DETAILED DESCRIPTION

Figure 1:
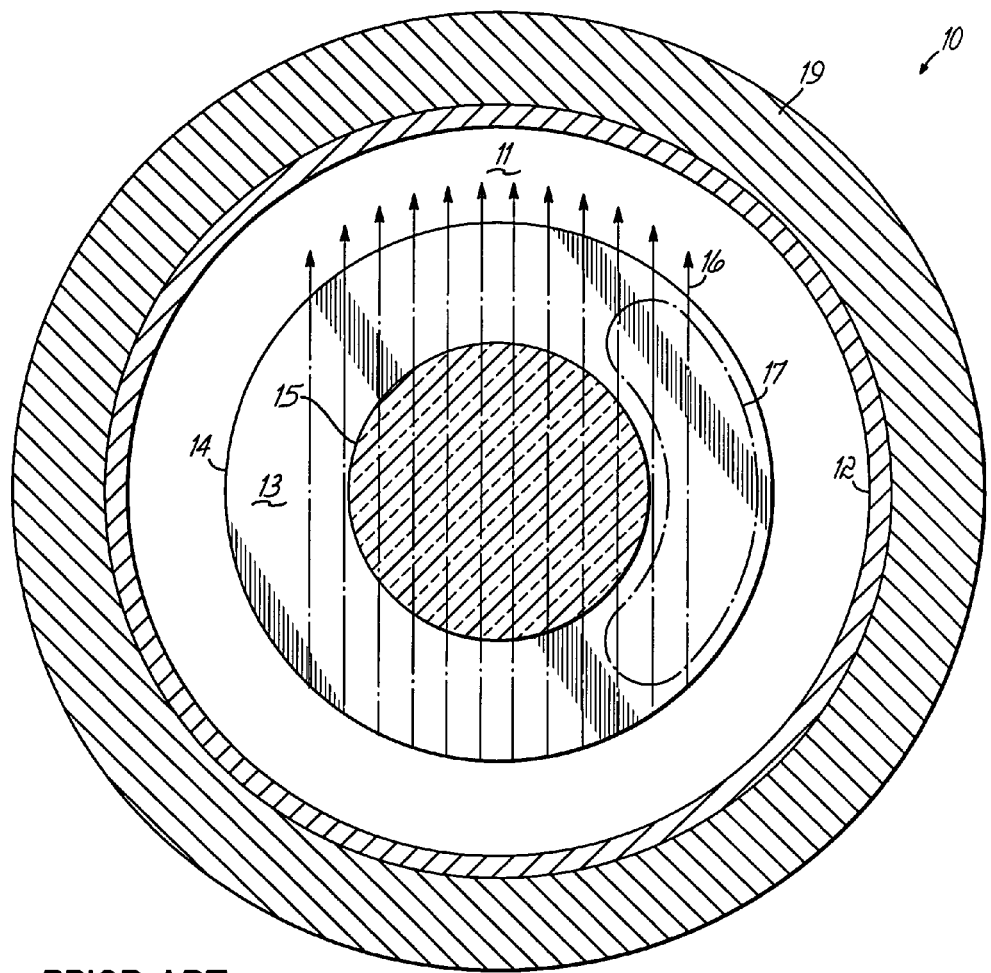
FIG. 1 is a cross-sectional view of a wafer processing chamber of the prior art employing magnetic enhancement of a plasma at a substrate support.

In the prior art plasma processing apparatus 10 of FIG. 1, a plasma processing chamber 11 is illustrated in cross-section through chamber wall 12 and facing a substrate supporting surface 13 of a substrate support 14 on which is centrally mounted a semiconductor wafer 15 for processing. Magnet structure (not shown), which may be outside of the chamber 11, generates a magnetic field 16 that is generally parallel to the substrate support surface 13. An RF generator (also not shown) coupled to the support 14, capacitively couples RF energy into gas within the chamber 11 to energize a plasma. The plasma tends to be produced in a cycloid region 17 where cycloid orbits of electrons are induced by the RF energy in the presence of the magnetic field 16. The plasma is axially unsymmetrical and otherwise non-uniform. In such an apparatus 10, the plasma is frequently made axially symmetrical at least by the use of a magnet arrangement that is made to rotate by costly and complex rotation hardware.

Figure 2:
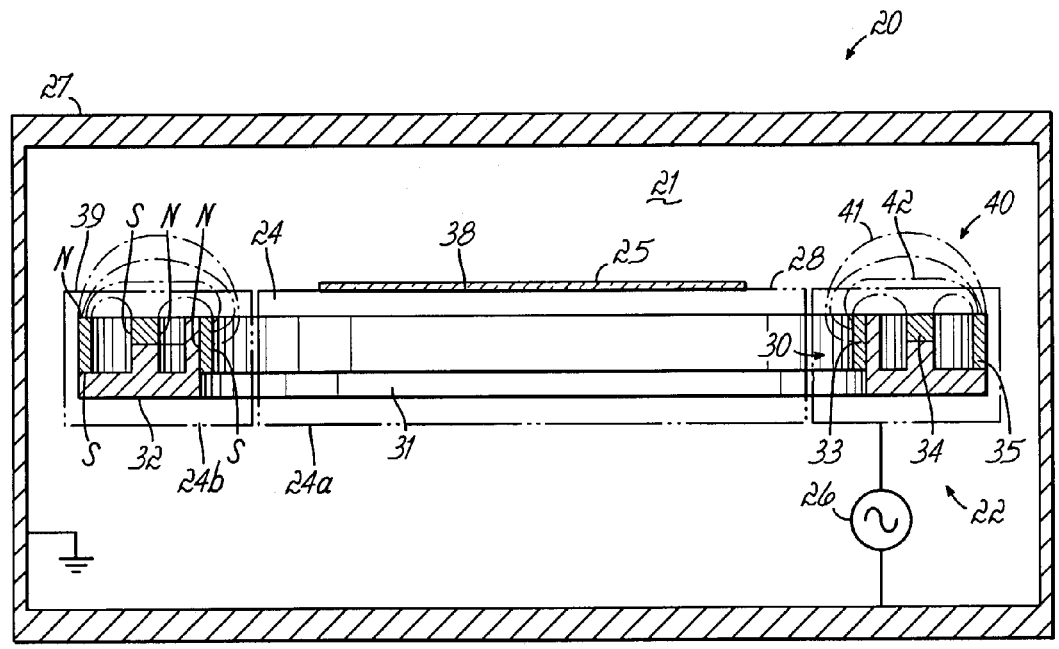
FIG. 2 is a cross-sectional view of a wafer processing chamber employing magnetic enhancement of a plasma at a substrate support according to an embodiment of the present invention using a magnet arrangement behind the substrate support surface.

FIG. 2 illustrates a plasma processing apparatus 20 having a magnetically enhanced plasma source 22 within a vacuum processing chamber 21. The source 22 is partially built into a semiconductor wafer substrate support 24, which is shown supporting a semiconductor wafer 25 for processing on the supporting surface 28 thereof. The substrate supporting surface 28 has a central region 38 concentric therewith, on which the wafer 25 is supported, and an annular peripheral surface region 39, which surrounds the central surface region 38 and is concentric with it. An RF generator 26, connected between the support 24 and grounded chamber wall 27, couples RF energy to the substrate support 24 which causes the support 24 to develop a negative potential.

Magnetic enhancement of the source 22 is provided by an annular permanent magnet assembly 30 arranged in the substrate support 24 behind the annular peripheral region 39 of the wafer supporting surface 28 of the support 24. A circular piece of high magnetic permeability material 31, such as mild steel, has an annular rim portion 32 that is configured to interface with a plurality of annular magnet rings, including an inner ring 33, an outer ring 35, and an intermediate ring 34. The inner ring 33 is oriented with its polar N/S axis parallel to the surface 28 in a radial direction while the outer ring 35 is oriented with its polar N/S axis perpendicular to the surface 28. The pole of the magnet 35 that is closest to the surface 28 is of the opposite polarity as the pole of the magnet 33 that faces the center of the support 24. The piece of magnetic material 31 is configured such that the polar axes of each of the magnets 33–35 are perpendicular to it. The material 31 creates a magnetic circuit between the magnet rings 33 and 35 and results in a magnetic field 40 of which lines of magnet flux 41 project from opposite poles of the respective magnets 33 and 35 into the processing space within the chamber 11. These flux lines 41 have a component parallel to the surface 28 but arc over it.

The intermediate magnet ring 34 is configured and arranged between the magnet rings 33 and 35 on the material 31 to divert magnetic flux lines from the magnet rings 33 and 35, producing resultant magnetic flux lines 42 that are generally flat and parallel to the surface 28. The polar axis of the intermediate magnetic ring 34 is parallel to the surface 28 and is oriented in a radial direction on the support 24 that is opposite that of the polar axis of magnet 33.

Figure 3:
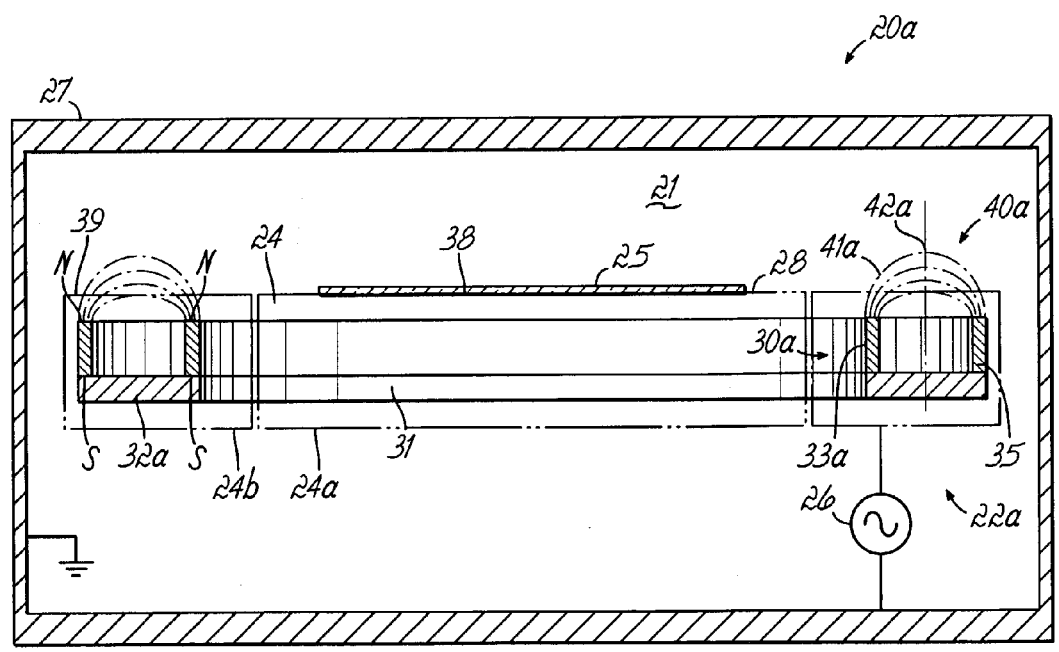
FIG. 3 is a cross-sectional view, similar to FIG. 2, of a wafer processing chamber employing magnetic enhancement of a plasma at a substrate support according to another embodiment of the present invention using a magnet arrangement behind the substrate support surface.

FIG. 3 illustrates an embodiment of an apparatus 20a having a source 22a that is similar to the source 22 with a magnet assembly 30a without the intermediate magnet ring 34. This embodiment has an inner ring 33a having a polar axis that is perpendicular to the surface 28 of the substrate support 24. The magnet rings 35 and 33a are supported on high permeability material 31a that is in the shape of a generally flat disk with a coplanar outer region. The N/S polar axes of the magnets 33a and 35 are generally opposite. The magnets produce a magnetic field 40a that arcs over the peripheral surface region 29 of the support 24 with lines of flux 41a that have components parallel to the surface 28 but that are completely parallel to the surface 28 only along a circular line 42a generally on a cylindrical surface.

Figure 4:
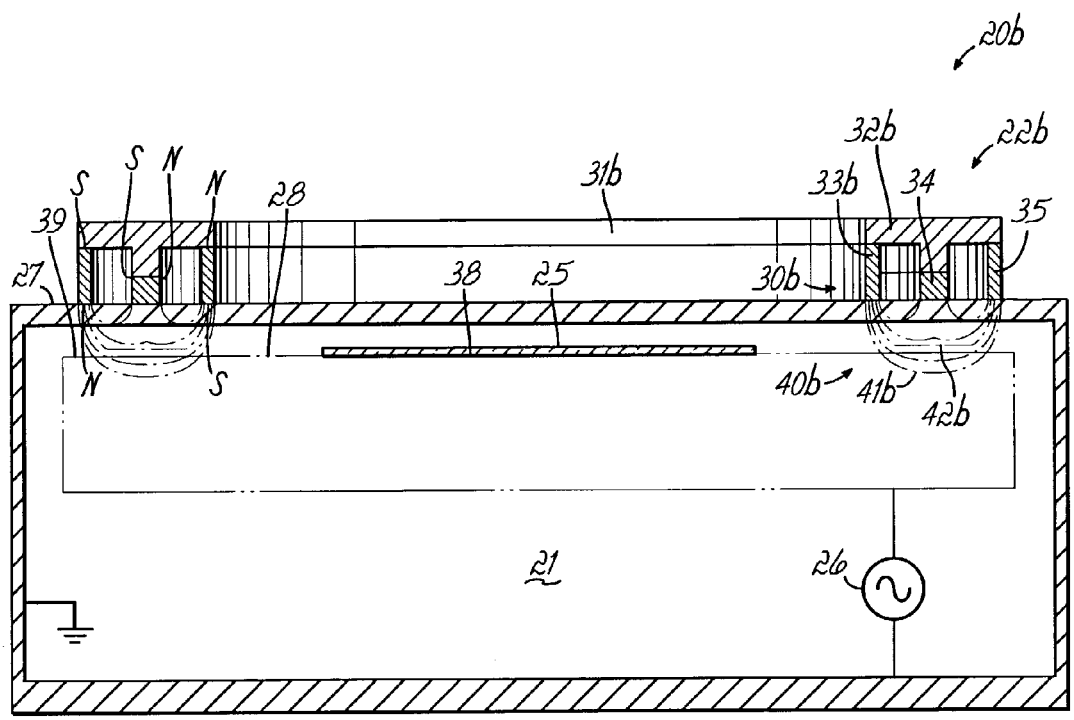
FIG. 4 is a cross-sectional view, similar to FIGS. 2 and 3, of a wafer processing chamber employing magnetic enhancement of a plasma at a substrate support according to an embodiment of the invention using a magnet arrangement opposite the substrate support surface and outside of the chamber.

FIG. 4 illustrates an embodiment of an apparatus 20b having a source 22b that is similar to the source 22 but with a magnet assembly 30b located outside of the chamber 11. This embodiment has an inner ring 33b having a polar axis that is perpendicular to the surface 28 of the substrate support 24. The magnet rings 33b, 34 and 35 are supported on high permeability material 31b that is in the shape of a generally flat disk. The N/S polar axes of the magnets 33a and 35 are generally opposite. The magnets produce a magnetic field 40b that arcs through the peripheral surface region 39 from the opposing chamber wall, of flux 41b that have components parallel to the surface 28. This configuration is useful for etch applications and other applications which, unlike iPVD processing equipment, has space for the mounting of the magnet assembly at the chamber wall or outside the chamber 11.

Figure 5:
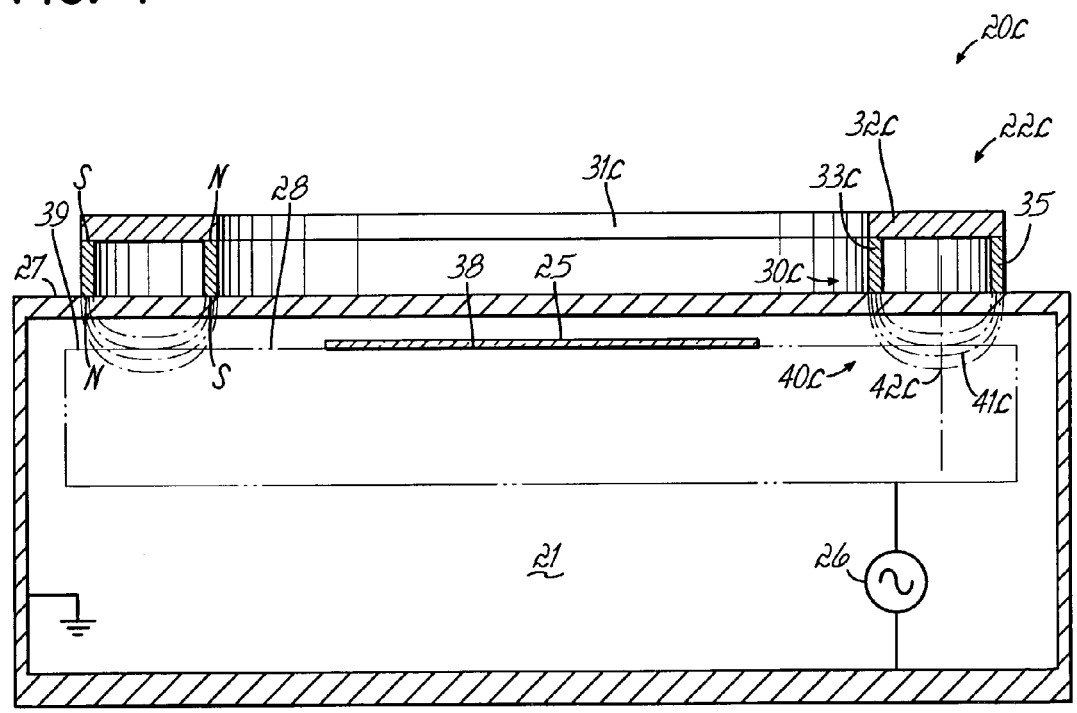
FIG. 5 is a cross-sectional view, similar to FIG. 4, of a wafer processing chamber employing magnetic enhancement of a plasma at a substrate support according to a further embodiment of the invention using a magnet arrangement opposite the substrate support surface and outside of the chamber.

FIG. 5 illustrates an embodiment of an apparatus 20c having a source 22c that has a magnet assembly similar to that of source 22a but is externally located similar to the source 22b.

The above description is of certain embodiments of the invention. Those skilled in the art will appreciate that various additions and modifications can be made without departing from the principles of the invention.

The invention claimed is:

1. A plasma processing apparatus comprising:
a vacuum chamber;
a wafer support within the chamber having a central wafer supporting surface lying in a plane and an annular peripheral surface surrounding the central wafer supporting surface and lying in the plane;
an RF generator coupled to the wafer support; and
an annular permanent magnet assembly adjacent the annular peripheral surface of the wafer support and having at least two poles configured to form an annular magnetic tunnel adjacent the annular peripheral surface and surrounding the central wafer supporting surface so as to trap plasma forming electrons in the tunnel away from a wafer on the central wafer supporting surface such that a plasma formed in the tunnel diffuses inwardly from the tunnel and over the surface of a wafer supported on the central wafer supporting surface;
the annular permanent magnet assembly being configured to produce a resultant magnetic field over the surfaces of the wafer support that includes resultant magnetic flux lines generally parallel to the annular peripheral surface in the region thereof and generally isolated from the central wafer supporting surface in the region thereof;
the annular permanent magnet assembly including at least two annular magnet rings including an outer annular magnet ring and a second annular magnet ring located within the outer annular magnet ring, the rings each having north and south magnetic poles, the second magnet ring being either an inner annular magnet ring or an intermediate annular magnet ring located between the outer annular magnet ring and an inner annular magnet ring;
the outer annular magnet ring having a polar axis perpendicular to the surfaces of the wafer support with a first pole thereof facing the annular peripheral surface of the wafer support; and
the second annular magnet ring having a polar axis parallel to the surfaces of the wafer support and having a pole thereof that is of the same polarity as the first pole of the outer annular magnet ring facing away from the central wafer supporting surface.

2. The apparatus of claim 1 wherein:
the annular permanent magnet assembly is located behind the annular peripheral surface of the wafer support and produces the magnetic tunnel with a magnetic field arcing from the poles of the assembly through and over the surfaces of the support.

3. The apparatus of claim 1 wherein:
the annular permanent magnet assembly is located opposite and is spaced from the annular peripheral surface of the wafer support and produces the magnetic tunnel with a magnetic field arcing from the poles of the assembly toward and through the surfaces of the support.

4. A plasma processing apparatus comprising:
a vacuum chamber;
a wafer support within the chamber having a central wafer supporting surface and an annular peripheral surface surrounding the central wafer supporting surface;
an RF generator coupled to the wafer support; and
an annular permanent magnet assembly adjacent the annular peripheral surface of the wafer support and having at least two poles configured to form an annular magnetic tunnel adjacent the annular peripheral surface and surrounding the central wafer supporting surface so as to trap plasma forming electrons in the tunnel away from a wafer on the central wafer supporting surface such that a plasma formed in the tunnel diffuses inwardly from the tunnel and over the surface of a wafer supported on the central wafer supporting surface;
the annular permanent magnet assembly including a piece of high magnetic permeability material, an outer annular magnet ring and an inner annular magnet ring, the rings each having north and south magnetic poles, opposite ones of which are in contact with, or in close proximity to, the piece of high magnetic permeability material;

the outer annular magnet ring having a polar axis perpendicular to the surfaces of the wafer support with a first pole thereof facing the annular peripheral surface of the wafer support; and the inner annular magnet ring having a polar axis parallel to the surfaces of the wafer support and having a pole thereof that is of the same polarity as the first pole of the outer annular magnet ring facing away from the central wafer supporting surface.

5. The apparatus of claim 4 wherein:

the annular permanent magnet assembly has an intermediate magnet ring that has a polar axis parallel to the surfaces of the wafer support having a pole thereof that is of the same polarity as the first pole of the outer annular magnet ring facing toward the central wafer supporting surface.

6. A plasma processing apparatus comprising:

a vacuum chamber;

a wafer support within the chamber having a central wafer supporting surface and an annular peripheral surface surrounding the central wafer supporting surface;

an RF generator coupled to the wafer support; and an annular permanent magnet assembly adjacent the annular peripheral surface of the wafer support and having at least two poles configured to form an annular magnetic tunnel adjacent the annular peripheral surface and surrounding the central wafer supporting surface so as to trap plasma forming electrons in the tunnel away from a wafer on the central wafer supporting surface such that a plasma formed in the tunnel diffuses inwardly from the tunnel and over the surface of a wafer supported on the central wafer supporting surface;

the annular permanent magnet assembly including a piece of high magnetic permeability material, an outer annular magnet ring and an inner annular magnet ring, the rings each having north and south magnetic poles, opposite ones of which are in contact with, or in close proximity to, the piece of high magnetic permeability material; and the outer annular magnet ring having a polar axis perpendicular to the surfaces of the wafer support;

the outer annular magnet ring having a first pole thereof facing the annular peripheral surface of the wafer support; and the annular permanent magnet assembly having an intermediate magnet ring that has a polar axis parallel to the surfaces of the wafer support having a pole thereof that is of the same polarity as the first pole of the outer annular magnet ring facing toward the central wafer supporting surface.

7. The apparatus of claim 6 wherein:

the outer annular magnet ring has a polar axis perpendicular to the surfaces of the wafer support; and the inner annular magnet ring has a polar axis perpendicular to the surfaces of the wafer support and opposite to that of the outer annular magnet ring.

8. A plasma source comprising:

a wafer support having an upwardly facing planar surface that includes a central wafer supporting surface and an annular peripheral surface surrounding the central wafer supporting surface;

an RF generator coupled to the wafer support; and an annular permanent magnet assembly adjacent the annular peripheral surface of the upwardly facing planar surface of the wafer support and having at least two annular magnetic poles, including an inner annular pole of a first polarity and an outer annular pole of the opposite polarity, configured to form a magnetic field over and parallel to the annular peripheral surface and perpendicular to the central wafer supporting surface that encloses the annular peripheral surface in a magnetic tunnel;

the annular permanent magnet assembly including at least two annular magnet rings including an outer annular magnet ring and a second annular magnet ring located within the outer annular magnet ring, the rings each having north and south magnetic poles, the second magnet ring being either an inner annular magnet ring or an intermediate annular magnet ring located between the outer annular magnet ring and an inner annular magnet ring;

the outer annular magnet ring having a polar axis perpendicular to the surfaces of the wafer support with a first role thereof facing the annular peripheral surface of the wafer support; and the second annular magnet ring having a polar axis parallel to the surfaces of the wafer support and having a pole thereof that is of the same polarity as the first pole of the outer annular magnet ring facing away from the central wafer supporting surface.

9. The source of claim 8 wherein:

the annular permanent magnet assembly forms a magnetic tunnel that is operative to trap plasma forming electrons excited by the RF generator in the tunnel away from a wafer on the central wafer supporting surface to form a plasma that diffuses inward from the tunnel and over the surface of a wafer supported on the central wafer supporting surface.

10. The source of claim 8 wherein:

the annular permanent magnet assembly includes a piece of high magnetic permeability material, an outer annular magnet ring and an inner annular magnet ring, the rings each having north and south magnetic poles, opposite ones of which are in contact with, or in close proximity to, the piece of high magnetic permeability material.

11. The source of claim 10 wherein:

the outer annular magnet ring has a polar axis perpendicular to the surfaces of the wafer support.

12. The source of claim 10 wherein:

the outer annular magnet ring has a polar axis perpendicular to the surfaces of the wafer support; and the inner annular magnet ring has a polar axis perpendicular to the surfaces of the wafer support and opposite to that of the outer annular magnet ring.

13. The source of claim 8 wherein:

the annular permanent magnet assembly is configured to produce a magnetic field that is generally flat over at least a portion of the annular peripheral surface.

14. The apparatus of claim 8 wherein:

the annular permanent magnet assembly is located behind the annular peripheral surface of the wafer support and produces the magnetic tunnel with a magnetic field arcing from the poles of the assembly through and over the surfaces of the support.

15. The apparatus of claim 8 wherein:

the annular permanent magnet assembly is located opposite and is spaced from the annular peripheral surface of the wafer support and produces the magnetic tunnel with a magnetic field arcing from the poles of the assembly toward and through the surfaces of the support.

16. A plasma source comprising:
a wafer support within the chamber having a central wafer supporting surface and an annular peripheral surface surrounding the central wafer supporting surface;
an RF generator coupled to the wafer support; and
an annular permanent magnet assembly adjacent the annular peripheral surface of the wafer support and having at least two poles configured to form an annular magnetic tunnel adjacent the annular peripheral surface and surrounding the central wafer supporting surface so as to trap plasma forming electrons in the tunnel away from a wafer on the central wafer supporting surface such that a plasma formed in the tunnel diffuses inwardly from the tunnel and over the surface of a wafer supported on the central wafer supporting surface;
the annular permanent magnet assembly including a piece of high magnetic permeability material, an outer annular magnet ring and an inner annular magnet ring, the rings each having north and south magnetic poles, opposite ones of, which are in contact with, or in close proximity to, the piece of high magnetic permeability material;
the outer annular magnet ring having a polar axis perpendicular to the surfaces of the wafer support with a first pole thereof facing the annular peripheral surface of the wafer support; and
the inner annular magnet ring having a polar axis parallel to the surfaces of the wafer support and having a pole thereof that is of the same polarity as the first pole of the outer annular magnet ring facing away from the central wafer supporting surface.

17. The source of claim 16 wherein:
the annular permanent magnet assembly has an intermediate magnet ring that has a polar axis parallel to the surfaces of the wafer support having a pole thereof that is of the same polarity as the first pole of the outer annular magnet ring facing toward the central wafer supporting surface.

18. A plasma source comprising:
a wafer support within the chamber having a central wafer supporting surface and an annular peripheral surface surrounding the central wafer supporting surface;
an RF generator coupled to the wafer support; and
an annular permanent magnet assembly adjacent the annular peripheral surface of the wafer support and having at least two poles configured to form an annular magnetic tunnel adjacent the annular peripheral surface and surrounding the central wafer supporting surface so as to trap plasma forming electrons in the tunnel away from a wafer on the central wafer supporting surface such that a plasma formed in the tunnel diffuses inwardly from the tunnel and over the surface of a wafer supported on the central wafer supporting surface;
the annular permanent magnet assembly including a piece of high magnetic permeability material, an outer annular magnet ring and an inner annular magnet ring, the rings each having north and south magnetic poles, opposite ones of which are in contact with, or in close proximity to, the piece of high magnetic permeability material;
the outer annular magnet ring having a polar axis perpendicular to the surfaces of the wafer support with a first pole thereof facing the annular peripheral surface of the wafer support; and
the annular permanent magnet assembly having an intermediate magnet ring that has a polar axis parallel to the surfaces of the wafer support having a pole thereof that is of the same polarity as the first pole of the outer annular magnet ring facing toward the central wafer supporting surface.

19. A plasma processing apparatus comprising:
a vacuum chamber;
a wafer support within the chamber having a central wafer supporting surface and a capacitively coupled plasma source that includes an annular peripheral surface surrounding the central wafer supporting surface that emits plasma forming electrons into the vacuum chamber;
an RF generator coupled to the wafer support; and
an annular permanent magnet assembly adjacent the annular peripheral surface of the wafer support and having at least two generally ring-shaped poles of opposite polarity configured to form a generally radial magnetic field enclosing an annular magnetic tunnel adjacent the annular peripheral surface and surrounding the central wafer supporting surface so as to trap plasma forming electrons emitted from the annular peripheral surface in the tunnel away from a wafer on the central wafer supporting surface such that a plasma formed in the tunnel diffuses inwardly from the tunnel and over the surface of a wafer supported on the central wafer supporting surface;
the annular permanent magnet assembly including at least two annular magnet rings including an outer annular magnet ring and a second annular magnet ring located within the outer annular magnet ring, the rings each having north and south magnetic poles, the second magnet ring being either an inner annular magnet ring or an intermediate annular magnet ring located between the outer annular magnet ring and an inner annular magnet ring;
the outer annular magnet ring having a polar axis perpendicular to the surfaces of the wafer support with a first pole thereof facing the annular peripheral surface of the wafer support; and
the second annular magnet ring having a polar axis parallel to the surfaces of the wafer support and having a pole thereof that is of the same polarity as the first pole of the outer annular magnet ring facing away from the central wafer supporting surface.

20. The apparatus of claim 19 wherein:
the annular permanent magnet assembly is located behind the annular peripheral surface of the wafer support and produces the magnetic tunnel with a magnetic field arcing from the poles of the assembly through and over the surfaces of the support.

21. The apparatus of claim 19 wherein:
the annular permanent magnet assembly is located opposite, and is spaced from, the annular peripheral surface of the wafer support and produces the magnetic tunnel with a magnetic field arcing from the poles of the assembly toward and through the surfaces of the support.

22. The apparatus of claim 19 wherein:
the annular permanent magnet assembly includes a piece of high magnetic permeability material, an outer annular magnet ring and an inner annular magnet ring, the rings each having north and south magnetic poles, opposite ones of which are in contact with, or in close proximity to, the piece of high magnetic permeability material.

* * * * *

UNITED STATES PATENT AND TRADEMARK OFFICE
CERTIFICATE OF CORRECTION

| | | |
|---|---|---|
| PATENT NO. | : 7,059,268 B2 | Page 1 of 1 |
| APPLICATION NO. | : 10/324213 | |
| DATED | : June 13, 2006 | |
| INVENTOR(S) | : Derrek Andrew Russell | |

It is certified that error appears in the above-identified patent and that said Letters Patent is hereby corrected as shown below:

Column 5, lines 3-4, reads "the polar axes of each of the magnets 33-35 are perpendicular to it" and should read --the polar axis of each of the magnets 33-35 is perpendicular to it--

Column 9, CLAIM 16, reads "opposite ones of, which are in contact with" and should read --opposite ones of which are in contact with--

TITLE OF THE PATENT, reads "method, apparatus and magnet assembly for enhancing and localizing a capacitively coupled plasma" and should read --apparatus and magnet assembly for enhancing and localizing a capacitively coupled plasma--

Signed and Sealed this

Second Day of January, 2007

JON W. DUDAS
*Director of the United States Patent and Trademark Office*